US008432089B2

(12) United States Patent
Yang et al.

(10) Patent No.: US 8,432,089 B2
(45) Date of Patent: Apr. 30, 2013

(54) LIGHT SOURCE MODULE AND BACKLIGHT MODULE

(75) Inventors: Chan-Shung Yang, Hsin-Chu (TW); Su-Yi Lin, Hsin-Chu (TW); Cheng-Chuan Chen, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 313 days.

(21) Appl. No.: 13/043,471

(22) Filed: Mar. 9, 2011

(65) Prior Publication Data

US 2012/0147625 A1  Jun. 14, 2012

(30) Foreign Application Priority Data

Dec. 8, 2010  (TW) ................................ 99142801 A

(51) Int. Cl.
*H01J 1/02* (2006.01)
*H01J 7/24* (2006.01)
*H01J 61/52* (2006.01)
*H01K 1/58* (2006.01)

(52) U.S. Cl.
USPC ........................................... 313/46; 362/612

(58) Field of Classification Search .................. 313/46, 313/45; 362/97.3, 612; 257/100, 88, 99, 257/98
See application file for complete search history.

(56) References Cited

U.S. PATENT DOCUMENTS

| 2007/0057364 A1* | 3/2007 | Wang et al. | 257/701 |
| 2008/0149373 A1* | 6/2008 | Kim et al. | 174/255 |
| 2009/0250709 A1* | 10/2009 | Chang et al. | 257/88 |
| 2009/0278162 A1* | 11/2009 | Wang et al. | 257/99 |
| 2010/0003788 A1* | 1/2010 | Wang et al. | 438/118 |
| 2011/0175511 A1* | 7/2011 | Lai | 313/46 |
| 2011/0175512 A1* | 7/2011 | Lai | 313/46 |
| 2011/0248616 A1* | 10/2011 | Lai | 313/46 |
| 2012/0037936 A1* | 2/2012 | Lu et al. | 257/98 |

FOREIGN PATENT DOCUMENTS

| JP | 2006270002 | 10/2006 |
| TW | 582122 | 4/2004 |
| TW | M259319 | 3/2005 |
| TW | I238692 | 8/2005 |
| TW | I258029 | 7/2006 |
| WO | WO 2011007874 A1 * | 1/2011 |

* cited by examiner

*Primary Examiner* — Mariceli Santiago
*Assistant Examiner* — Glenn Zimmerman
(74) *Attorney, Agent, or Firm* — Winston Hsu; Scott Margo

(57) ABSTRACT

A light source module and a backlight module therewith are disclosed. The light source includes a circuit board and a light-emitting diode disposed on the circuit board. The light-emitting diode includes a package unit and a conductive support. The package unit includes an insulation housing, a heat-dissipating support embedded in the insulation housing, and a light-emitting diode chip disposed on the heat-dissipating support and encapsulated by the insulation housing. The light-emitting diode chip includes two electrodes, which are isolated form the heat-dissipating support. The insulation housing thereon defines a light-out surface. The conductive support is disposed on an exterior side surface of the insulation housing and connected to the heat-dissipating support to protrude out the light-out surface. Thereby, the protruding conductive support is also isolated from the two electrodes so as to perform ESD protection for avoiding unexpected damage to the light-emitting diode and extending service life thereof.

19 Claims, 11 Drawing Sheets

LIGHT SOURCE MODULE AND BACKLIGHT MODULE

BACKGROUND OF THE INVENTION

1. Field of the Invention

The invention relates to a light source module and a backlight module having the light source module, and especially relates to a light source module and a backlight module with anti-electrostatic discharge structure.

2. Description of the Prior Art

Light emitting diodes (LEDs) have advantages of small volume, long service life, and so on, so LEDs have been widely applied to various electronic apparatus with demand for light, such as illumination lamps, home appliances with optical indication function, computers, and communication products. Furthermore, as the light-emitting technology for LED develops, the luminous power and the stability of emitting light improve greatly. LEDs have been the mainstream of future light sources.

There are many liquid crystal displays (LCDs) in the market using LEDs as light sources thereof. However, LEDs like other common semiconductor electronic components is easily affected by electrostatic discharge (ESD), even to be damaged. For this problem, a conventional light source module can project an LED thereof by a Zener diode parallel connected with the LED so that a surge current due to ESD can pass through the Zener diode. However, the solution of using Zener diodes is still restricted. A configuration space for the Zener diode is necessarily preserved in the whole light-emitting device; the allowance capability of the Zener diode also restricts the degree of protection on the LED.

Therefore, the current ESD protection is still restricted and increases the manufacturing cost and the manufacturing difficulty of LEDs. There is a demand for an LED structure without excessive manufacturing load in the LED production, which can break through the restrictions based on the component specification of the conventional Zener diode so as to solve the above problem.

SUMMARY OF THE INVENTION

An objective of the invention is to provide a light source module, which uses a conductive support formed by extending a heat-dissipating support of a light-emitting diode thereof to protrude out an insulation housing of the light-emitting diode for conducting exterior static electricity, so as to avoid influence on a light-emitting diode chip inside the light-emitting diode.

A light source module according to the invention includes a circuit board and a light-emitting diode. The light-emitting diode is disposed on the circuit board and includes a package unit and a conductive support. The package unit includes an insulation housing, a heat-dissipating support embedded in the insulation housing, and a light-emitting diode chip disposed on the heat-dissipating support and encapsulated by the insulation housing. The light-emitting diode chip has two electrodes. The heat-dissipating support is isolated form the two electrodes. The insulation housing thereon defines a light-out surface; therein, light emitted by the light-emitting diode chip travels out of the package unit through the light-out surface. The conductive support is disposed on an exterior side surface of the insulation housing and is connected to the heat-dissipating support to protrude out the light-out surface. Thereby, the exterior static electricity discharged to the light-emitting diode is conducted out through the conductive support, so that the light-emitting diode chip can avoid damage due to electric shocks by the exterior static electricity. Furthermore, in practice, the conductive support and the heat-dissipating support can be made in one piece, so relative to a common light-emitting diode in the prior art, the load and cost of the production of the light-emitting diode according to the invention does not increase substantially, and relative to a conventional light-emitting diode with a Zener diode, the light-emitting diode according to the invention does not need any Zener diode so that the production thereof is relatively stable and the cost thereof is relatively inexpensive. Significantly, the light source module according to the invention not only has advantages of low cost and simplified production but also break through the restrictions based on the component specification of the Zener diode to provide ESD protection so as to solve the problem in the prior art.

Another objective of the invention is to provide a backlight module using a light source module according to the invention, so the backlight module also can protect the light-emitting diode chip inside the light source module from electric shocks by the exterior static electricity to provide stable backlight.

A backlight module according to the invention includes a circuit board, a light-guiding member, and a light-emitting diode. The light-guiding member has a light-in surface and a first light-out surface. The light-emitting diode is disposed on the circuit board and includes a package unit and a conductive support. The package unit includes an insulation housing, a heat-dissipating support embedded in the insulation housing, and a light-emitting diode chip disposed on the heat-dissipating support and encapsulated by the insulation housing. The light-emitting diode chip has two electrodes. The heat-dissipating support is isolated form the two electrodes. The insulation housing thereon defines a second light-out surface. The second light-out surface is substantially toward the light-in surface; therein, light emitted by the light-emitting diode chip travels out of the package unit through the second light-out surface into the light-guiding member through the light-in surface. The conductive support is disposed on an exterior side surface of the insulation housing and is connected to the heat-dissipating support to protrude out the second light-out surface. Similarly, the exterior static electricity discharged to the light-emitting diode is conducted out through the conductive support, so that the light-emitting diode chip can avoid damage due to electric shocks by the exterior static electricity. The advantage of the backlight module according to the invention is the same as described above and is no longer described.

In sum, for the light-emitting diode, though the exterior static electricity may come from other electronic components assembled with the backlight module or from the light-guiding member and may be induced in the product assembly or in the operation, all the exterior static electricity can be conducted by the conductive support of the light source module or the backlight module according to the invention so that the light-emitting diode chip can avoid electric shocks by the exterior static electricity to work normally, so as to provide stable backlight and extend service lift. Therefore, compared with the prior art, the light source module and the backlight module according to the invention have the advantages of low cost and simplified production and break through the restrictions based on the component specification of the Zener diode to provide ESD protection so as to solve the problem in the prior art.

These and other objectives of the present invention will no doubt become obvious to those of ordinary skill in the art after

DETAILED DESCRIPTION

Figure 1:
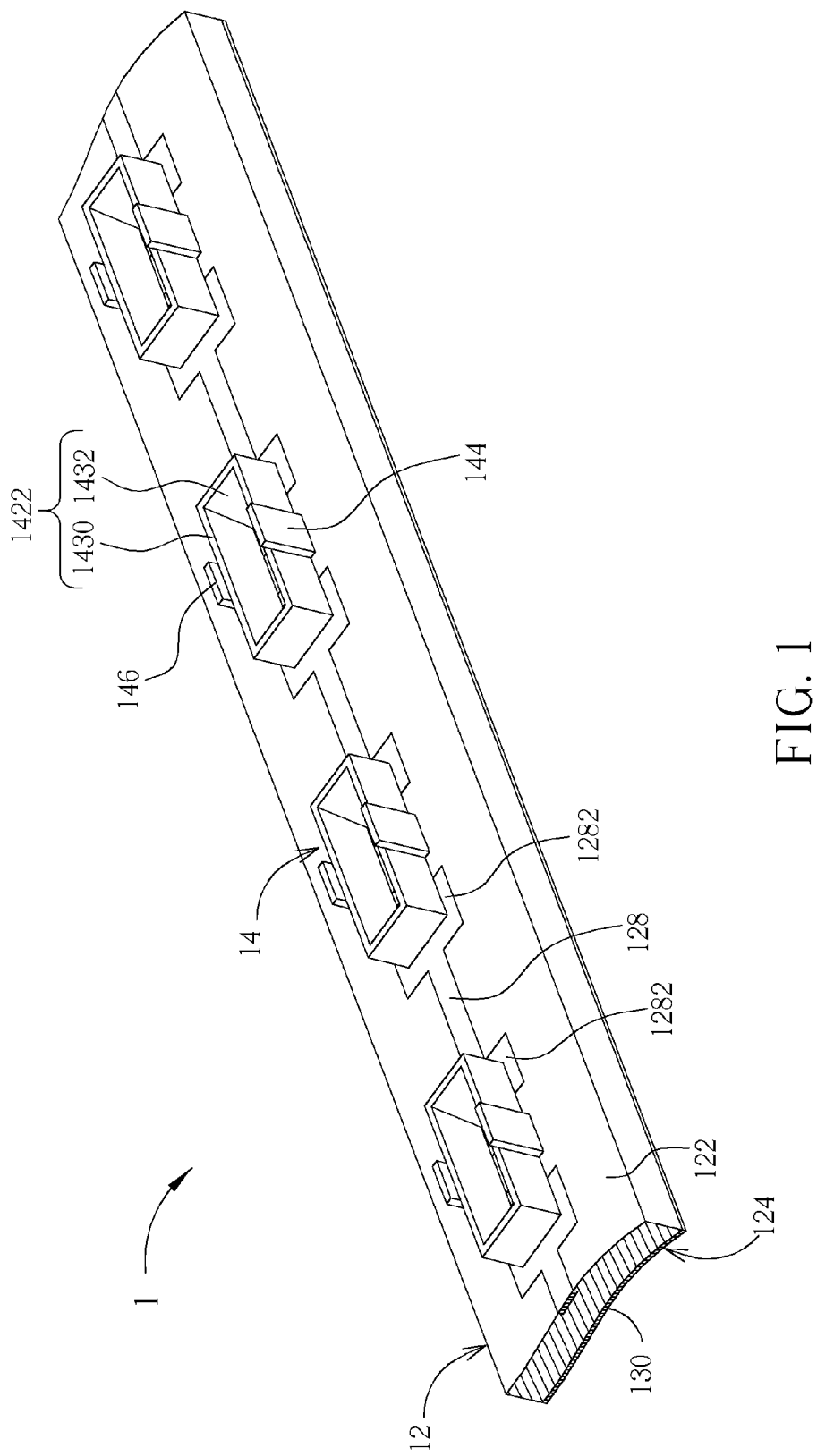
FIG. 1 is a schematic diagram of a light source module of a preferred embodiment according to the invention.
Figure 2:
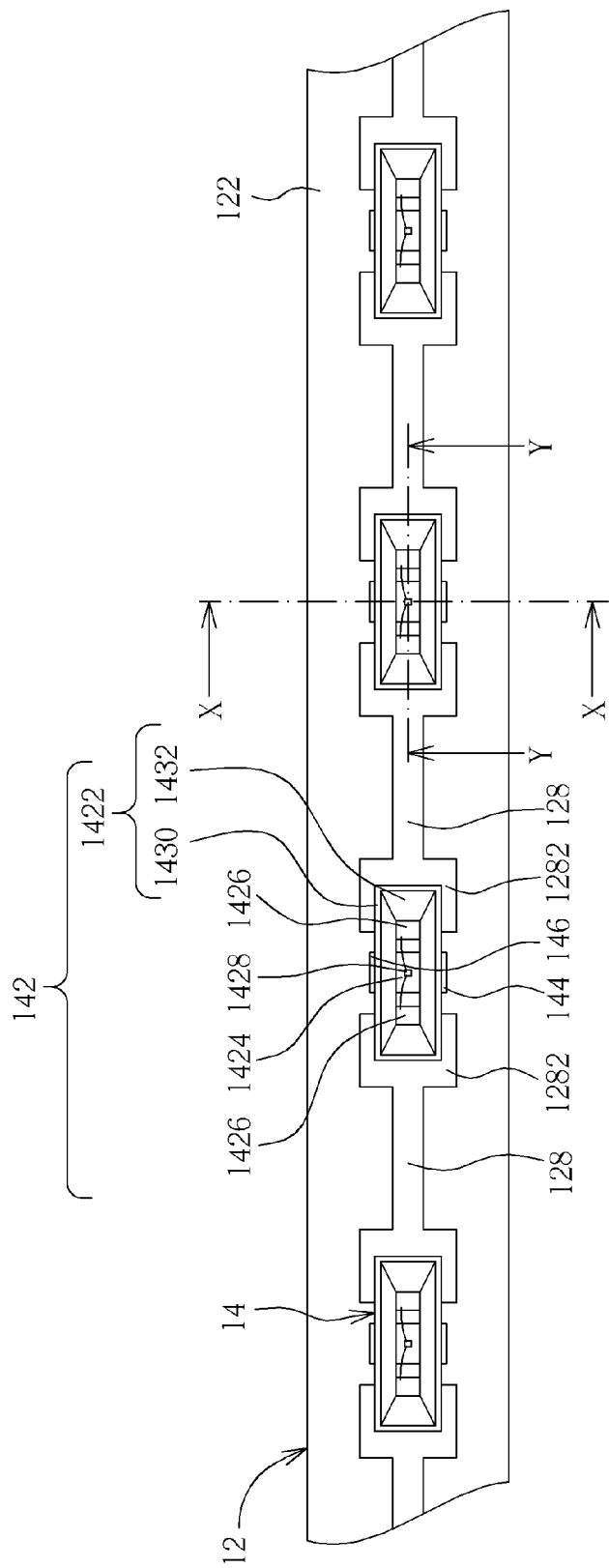
FIG. 2 is a top view of the light source module in FIG. 1.
Figure 3:
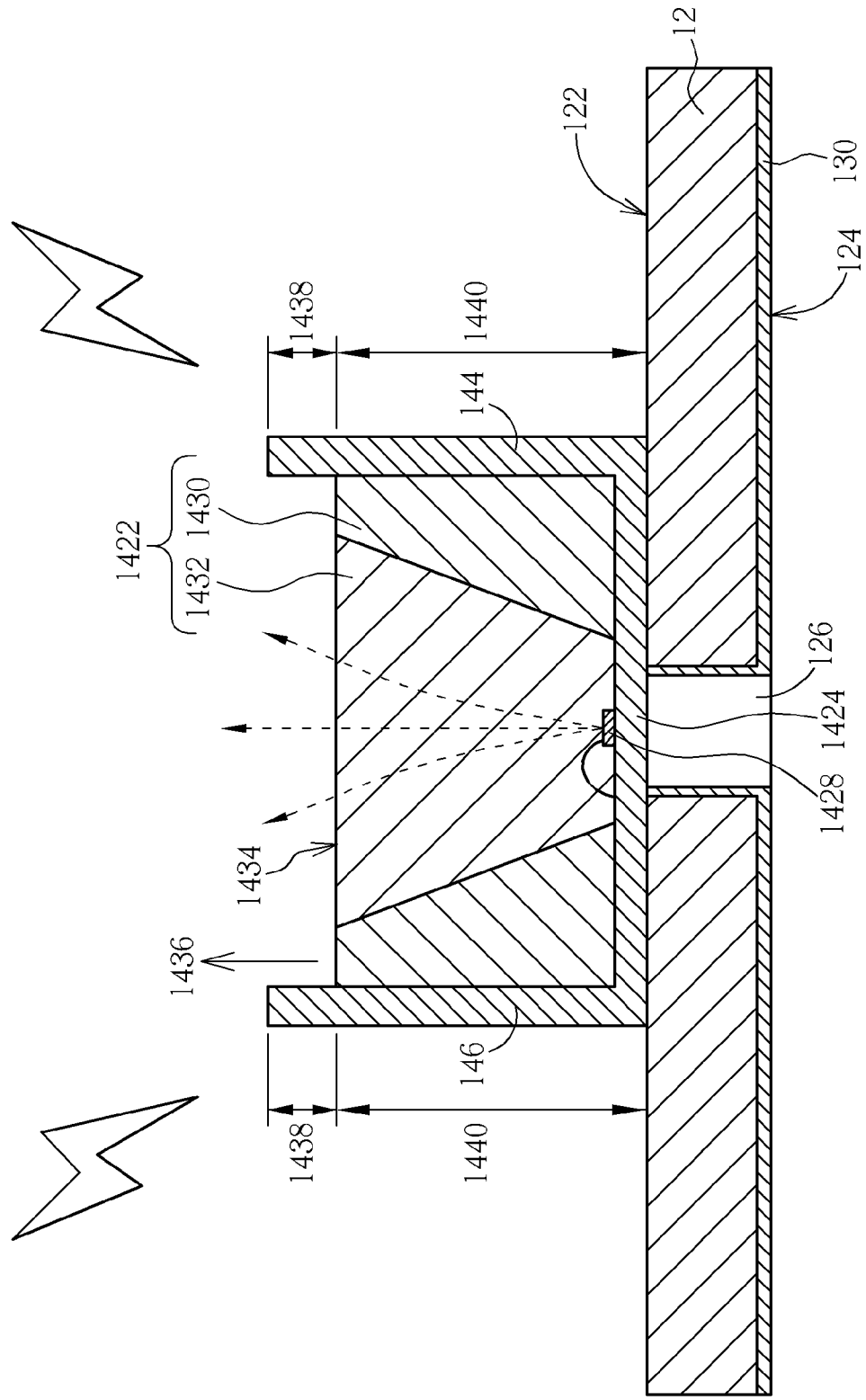
FIG. 3 is a sectional diagram along the line X-X of the light source module in FIG. 1.
Figure 4:
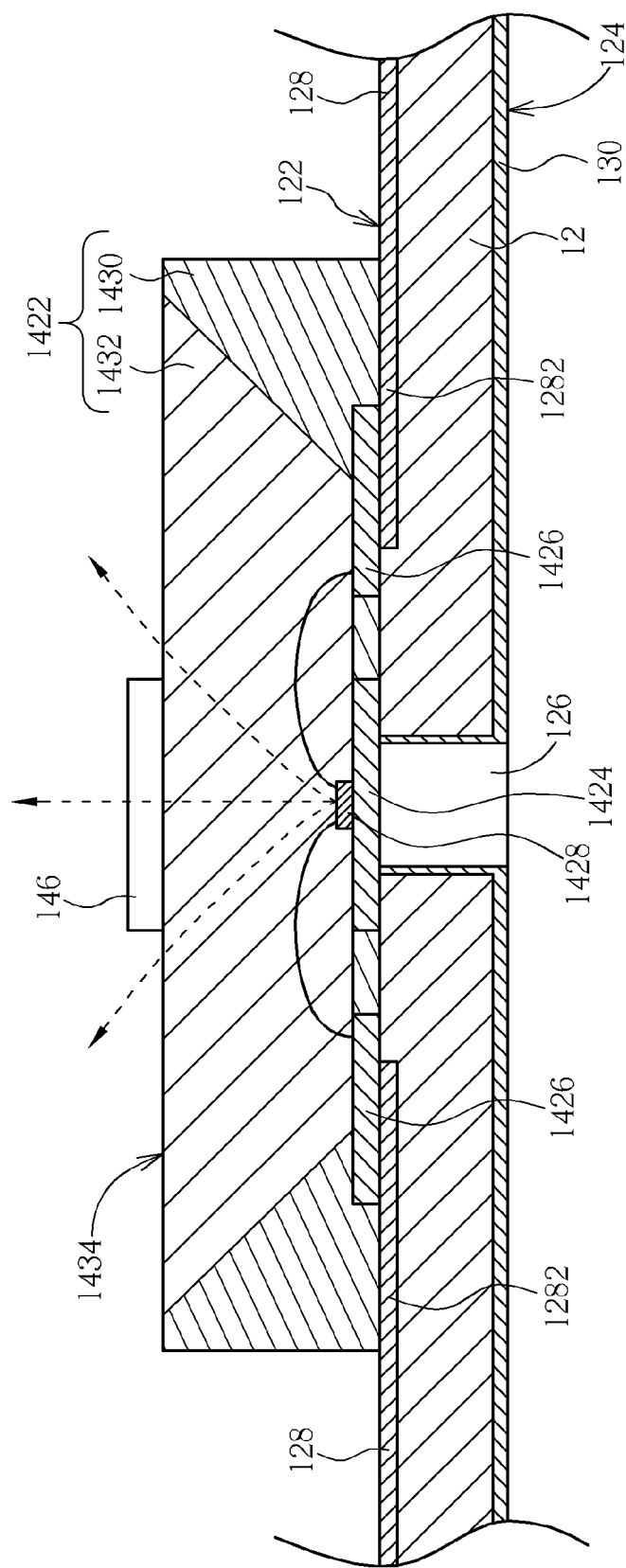
FIG. 4 is another sectional diagram along the line Y-Y of the light source module in FIG. 1.

Please refer to FIGS. 1 through 4. FIG. 1 is a schematic diagram of a light source module 1 of a preferred embodiment according to the invention. FIG. 2 is a top view of the light source module 1 in FIG. 1. FIG. 3 is a sectional diagram along the line X-X of the light source module 1 in FIG. 1. FIG. 4 is another sectional diagram along the line Y-Y of the light source module 1 in FIG. 1. The light source module 1 includes a circuit board 12 and a plurality of light-emitting diodes 14 disposed on the circuit board 12. Each of the light-emitting diodes 14 includes a package unit 142, a first conductive support 144, and a second conductive support 146. The package unit 142 includes an insulation housing 1422, a heat-dissipating support 1424 and two electrode supports 1426 embedded in the insulation housing 1422, and a light-emitting diode chip 1428. Therein, the insulation housing 1422 includes a plastic member 1430 and a seal gel 1432. The plastic member 1430 is formed by injection together with the heat-dissipating support 1424 and the electrode supports 1426. The plastic member 1430 forms a cupped accommodating space. The light-emitting diode chip 1428 is disposed on the heat-dissipating support 1424 and has two electrodes (not indicated in the figures) electrically connected to the two electrode supports 1426 by wire bonding respectively. The heat-dissipating support 1424 is insulated from the two electrodes and separated from the electrode supports 1426. The capped plastic member 1430 is filled with the transparent seal gel 1432 so that the light-emitting diode chip 1428 is encapsulated by the insulation housing 1422. The insulation housing 1422 thereon defines a light-out surface 1434, which is equivalent to an exterior surface. If the plastic member 1430 is filled fully with the seal gel 1432, the light-out surface 1434 is a surface of the seal gel 1432; if the plastic member 1430 is still protrusive to the seal gel 1432, the light-out surface 1434 is an imaginary surface formed by protrusive portions of the plastic member 1430. Light (shown by dashed lines with arrows in FIG. 3 and FIG. 4) emitted by the light-emitting diode chip 1428 travels out the package unit 142 through light-out surface 1434. The first conductive support 144 and the second conductive support 146 are oppositely disposed on exterior side surfaces and connected to the heat-dissipating support 1424 to protrude out the light-out surface 1434.

It is added that, in the embodiment, the first conductive support 144 and the second conductive support 146 together with the heat-dissipating support 1424 are formed in a time, in practice, by stamping process. Therefore, the first conductive support 144 and the second conductive support 146 are also involved in the injection process of the plastic member 1430 together with the heat-dissipating support 1424; however, the invention is not limited to this. For example, the first conductive support 144 and the second conductive support 146 are connected to the heat-dissipating support 1424 by welding or other bonding methods after the package unit 142 is completed.

Further, the circuit board 12 has a first surface 122, a second surface 124 opposite to the first surface 122, and a conductive via 126 passing through the first surface 122 and the second surface 124. The circuit board 12 forms a circuit 128 on the first surface 122. The circuit 128 includes a plurality of solder pads 1282 corresponding to the electrode supports 1426 of the package units 142. The light-emitting diodes 14 are disposed on the first surface 122. The electrode supports 1426 of the package units 142 are soldered to the corresponding solder pads 1282 for obtaining power so that the light-emitting diode chips 1428 emit light. The circuit board 12 forms a grounding electrode 130 on the second surface 124. The conductive via 126 is realized by coating a conductive material on an inner wall of a hole. In the embodiment, the heat-dissipating support 1424 and the conductive via 126 are connected directly, so the first conductive support 144 and the second conductive support 146 connected to the heat-dissipating support 1424 are connected to the grounding electrode 130 through the heat-dissipating support 1424 and the conductive via 126.

Please refer to FIG. 3. When there is exterior static electricity (shown by lighting icons) shocking the light-emitting diode 14, the first conductive support 144 and the second conductive support 146 protruding the light-out surface 1434 are the first to be affected. Therefore, the first conductive support 144 and the second conductive support 146 can conduct the static electricity through the heat-dissipating support 1424, the conductive via 126, and the grounding electrode 130, which avoids damage on the light-emitting diode chip 1428 in the package unit 142 due to the electric shock so as to solve the problem that the light-emitting diode in the prior art is damaged easily once electrically shocked. It is added that, if the height of the first conductive support 144 and the second conductive support 146 protruding out the light-out surface 1434 is short insufficiently, the effect of the conduction of ESD is reduced; if the height of the first conductive support 144 and the second conductive support 146 protruding out the light-out surface 1434 is long excessively, unnecessary ESD may be induced. In the embodiment, the height 1438 of the first conductive support 144 and the second conductive support 146 protruding out the light-out surface 1434 along a direction 1436 is 0.2 mm to 1 mm substantially; however, the invention is not limited to this. In practice, the setup for the height depends on the practical configuration of the light source module, especially on the relative positions to other components. In addition, in the embodiment, the first conductive support 144 and the second conductive support 146 connected to the heat-dissipating support 1424 also perform dissipating heat absorbed from the light-emitting diode chip 1428 in operation by the heat-dissipating support 1424.

Figure 5:
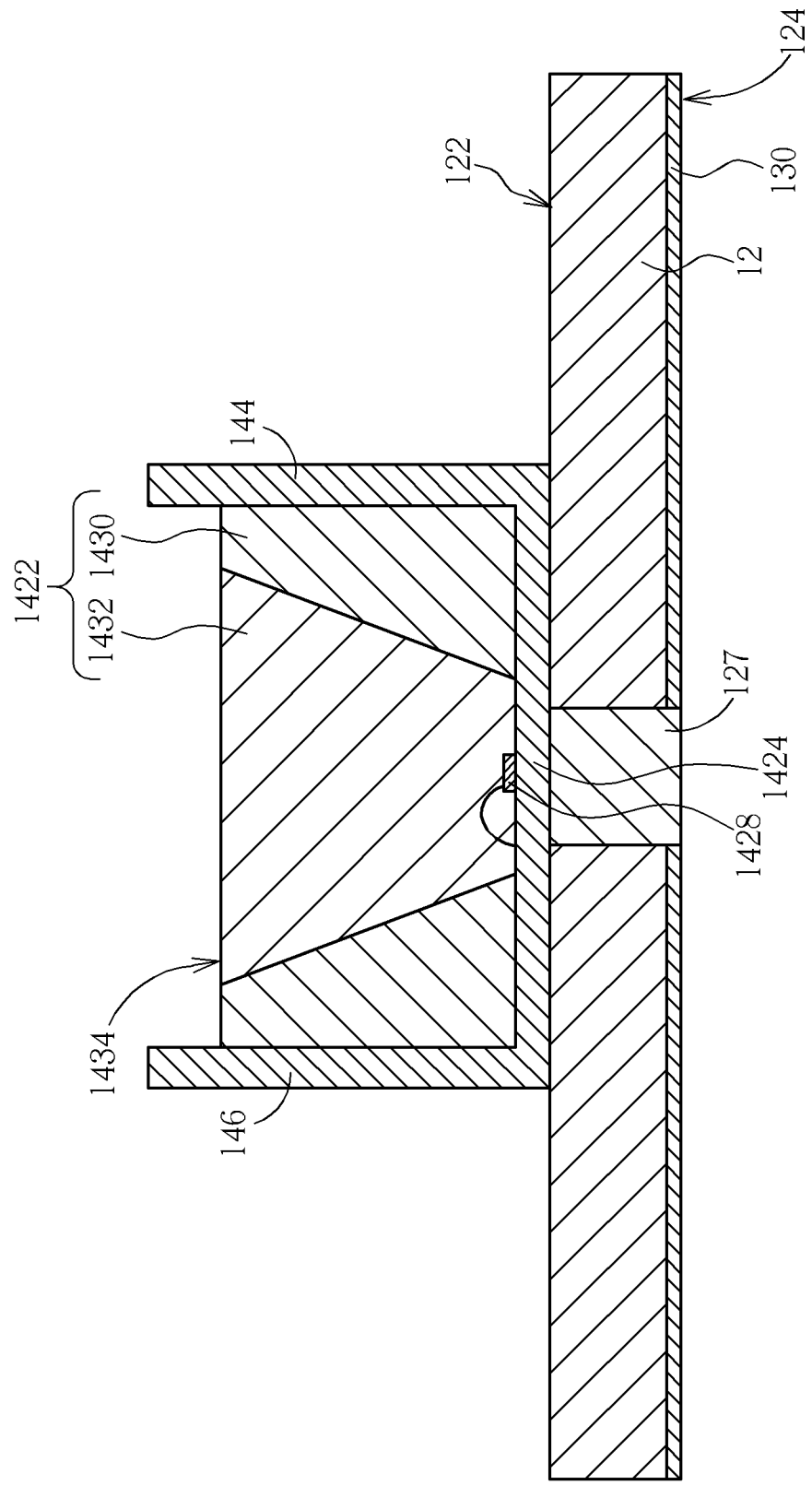
FIG. 5 is a sectional diagram of a light source module of another embodiment according to the invention.

Please refer to FIG. 5. FIG. 5 is a sectional diagram of a light source module of another embodiment according to the invention, and the position of the cutting line thereof is the same as FIG. 3. The difference between the light source module in FIG. 5 and the light source module 1 in FIG. 3 mainly lies in the fact that the light source module in FIG. 5 uses a conductive pillar 127 instead of the conductive via 126 to pass through the first surface 122 and the second surface 124 for connecting the grounding electrode 130 and the heat-dissipating support 1424. Similarly, the first conductive support 144 and the second conductive support 146 are electrically connected to the grounding electrode 130 through the heat-dissipating support 1424 and the conductive pillar 127 so as also to conduct the static electricity. Furthermore, in the embodiment, the conductive pillar 127 also performs as a good conductor in heat for dissipating heat absorbed from the light-emitting diode chip 1428 in operation by the heat-dissipating support 1424.

Figure 6:
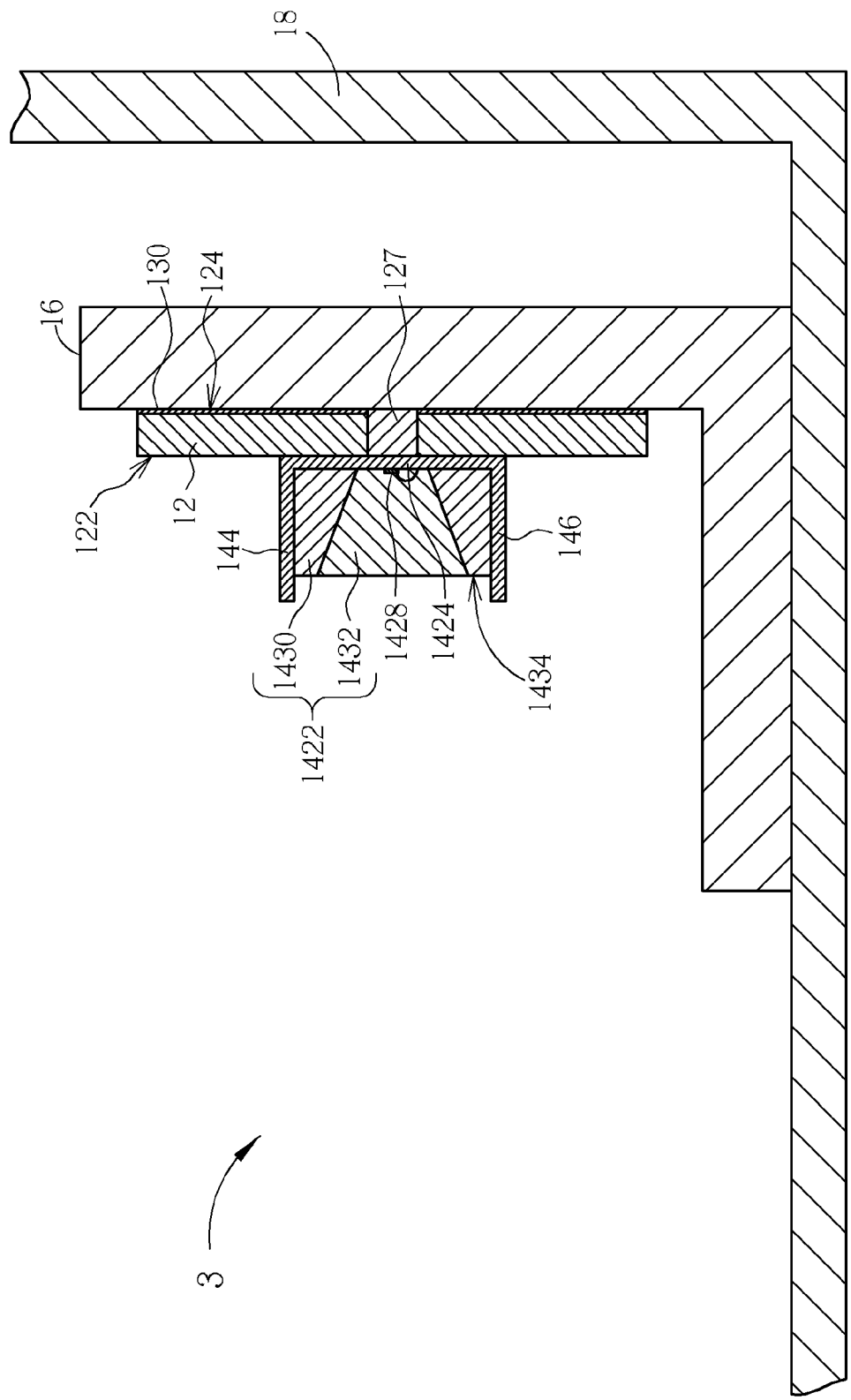
FIG. 6 is a sectional diagram of a light source module of another preferred embodiment according to the invention.
Figure 7:
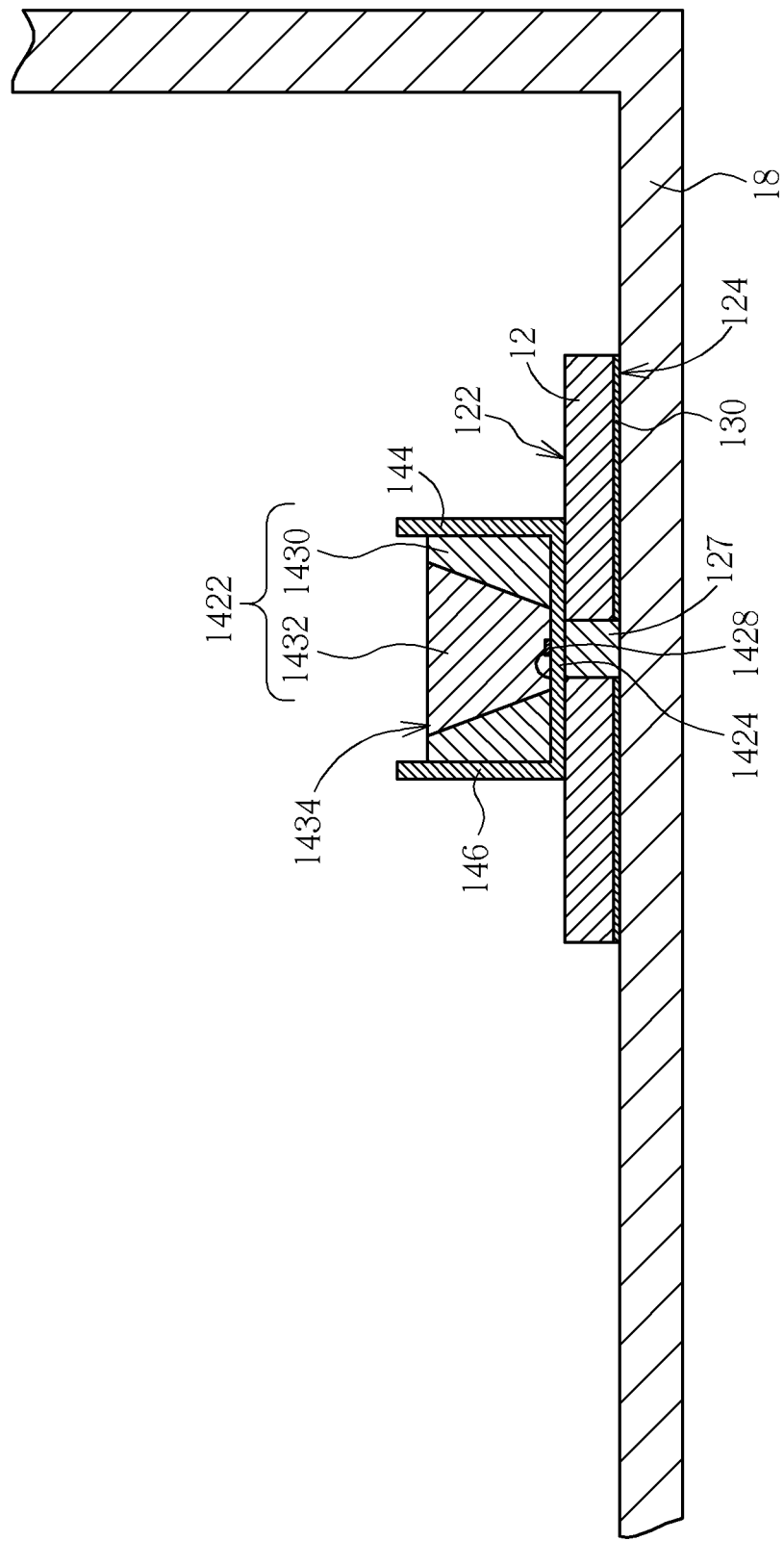
FIG. 7 is a sectional diagram of a light source module of an embodiment according to the invention.

The light-emitting diodes 14 in the above embodiments are connected in series in practice to form a light bar; however, the invention is not limited to this. For series connection or parallel connection, heat produced in operation by the light-emitting diodes is quite impressive, so there are usually heat-dissipating mechanisms applied in practice. Please refer to FIG. 6. FIG. 6 is a sectional diagram of a light source module 3 of another preferred embodiment according to the invention, and the position of the cutting line thereof is the same as FIG. 3. The difference between the light source module 3 and the light source module in FIG. 5 mainly lies in the fact that the light source module 3 further includes a heat sink 16 and a metal casing 18. The heat sink 16 is disposed outside the light-emitting diode 14 and connected to the heat-dissipating support 1424 of the light-emitting diode 14 and the metal casing 18 for dissipating heat produced in operation by the light-emitting diode chip 1428. In the embodiment, the circuit board 12 is disposed on the heat sink 16 so that the grounding electrode 130 can touch the heat sink 16 to realize the connection between the heat sink 16 and the heat-dissipating support 1424. Thereby, the heat sink 16 conducts the heat conducted from the conductive pillar 127 to the metal casing 18 to be dissipated. In practice, although the heat sink 16 can be a heat-dissipating metal block or a heat-dissipating plate with fins in the prior art, the heat sink 16 also can be other heat conductive casing, such as the outer casing of the light source module 3. Please refer to FIG. 7. FIG. 7 is a sectional diagram of a light source module of an embodiment according to the invention. The difference between the light source module in FIG. 7 and the light source module in FIG. 6 mainly lies in the fact that the light source module in FIG. 7 directly uses the metal casing 18 to be a heat-dissipating member, which also reaches the effect of heat dissipation.

Figure 8:
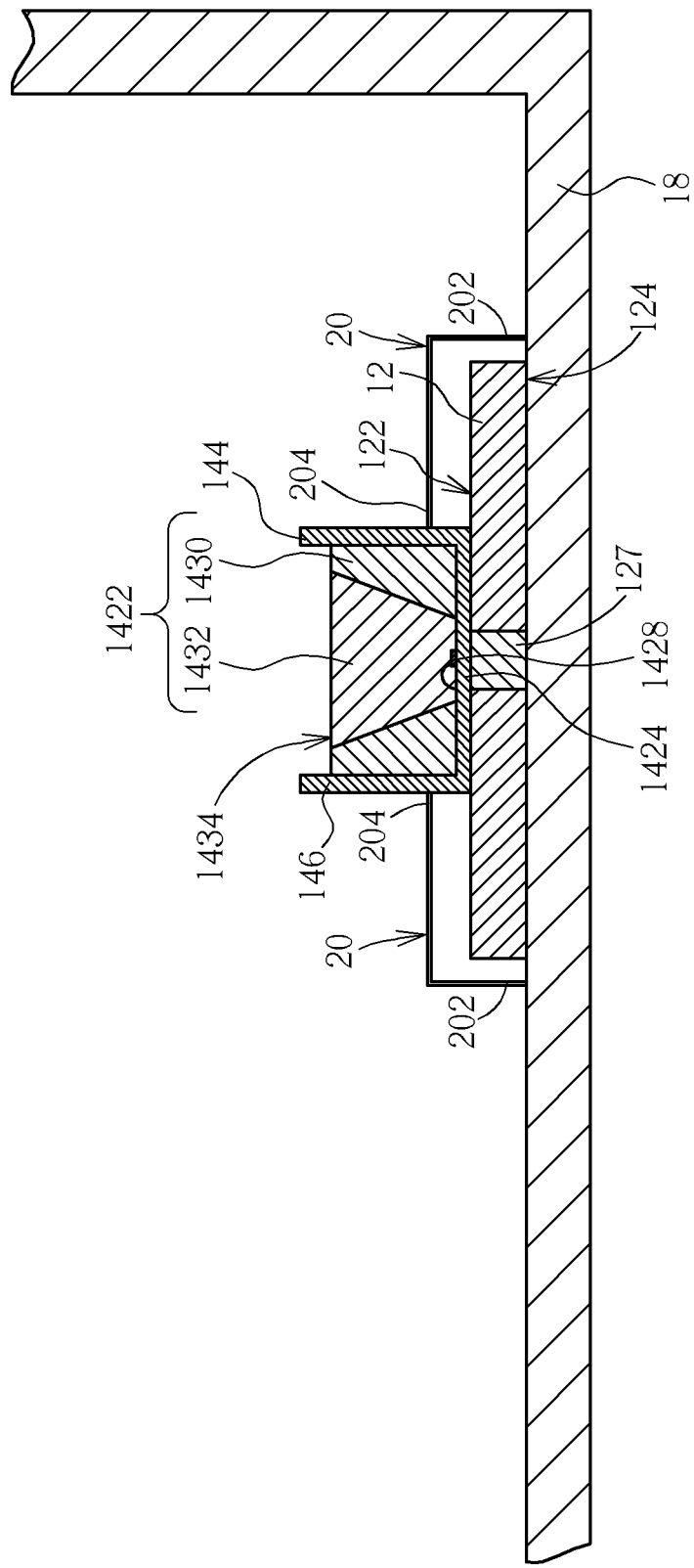
FIG. 8 is a sectional diagram of a light source module of another embodiment according to the invention.

In addition, in practice, if the grounding of the first conductive support 144 and the second conductive support 146 is not realized by the grounding electrode 130 of the circuit board 12, the grounding electrode 130 can be omitted. Please refer to FIG. 8. FIG. 8 is a sectional diagram of a light source module of another embodiment according to the invention. In the embodiment, the circuit board 12 no longer has the grounding electrode 130, and the conductive pillar 127 directly touches the metal casing 18, by which heat conducted though the conductive pillar 127 can be conducted directly to the metal casing 18. Furthermore, the light source module in FIG. 8 includes two wires 20. Ends 202 of the wires 20 are connected to the metal casing 18; other ends 204 of the wires 20 are connected to the first conductive support 144 and the second conductive support 146 respectively. The grounding of the first conductive support 144 and the second conductive support 146 are therefore realized.

Figure 9:
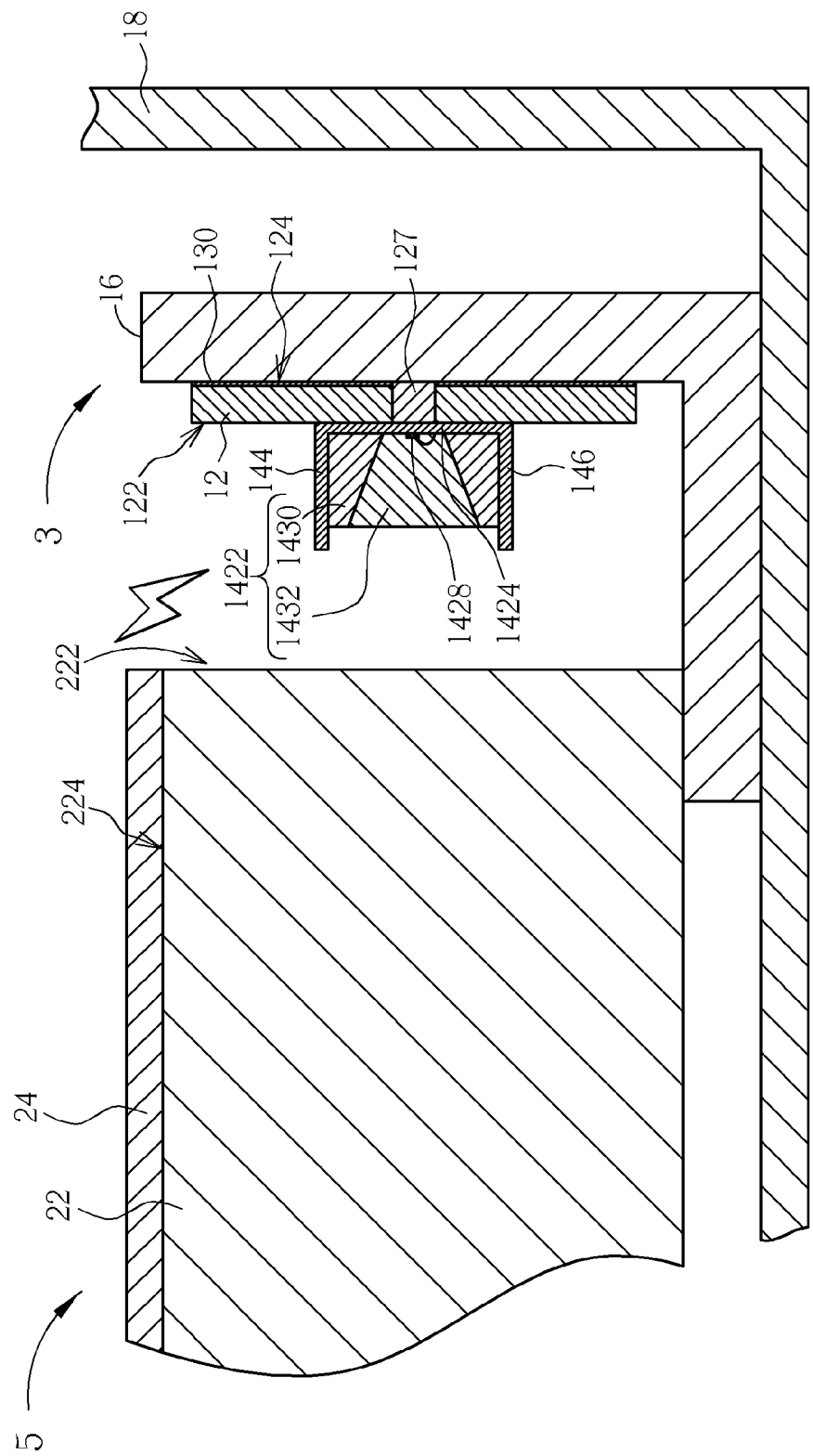
FIG. 9 is a sectional diagram of a backlight module of a preferred embodiment according to the invention.

As explained above, the light source module according to the invention has the property of anti-electrostatic discharge, so being capability of being applied to an apparatus with requirement of stable light. Please refer to FIG. 9. FIG. 9 is a sectional diagram of a backlight module 5 of a preferred embodiment according to the invention. The backlight module 5 includes the light source module 3 according to the invention, a Light-guiding member 22, and a laminated optical film 24. Therein, the Light-guiding member 22 has a light-in surface 222 and a light-out surface 224. The light-out surface 1434 defined on the insulation housing 1422 is toward the light-in surface 222 of the Light-guiding member 22. The laminated optical film 24 is disposed on the light-out surface 224 of the Light-guiding member 22 and may include a diffusion sheet, a prism sheet, a polarizing sheet, and soon. For descriptions of other members, please refer to the descriptions in the above embodiments and are no longer repeated here. Thereby, when there is exterior static electricity (shown by lighting icons), especially the static electricity accumulated on the laminated optical film 24 shocking the light-emitting diode 14, the first conductive support 144 protruding the light-out surface 1434 is the first to be affected. Therefore, the first conductive support 144 can conduct the static electricity through the heat-dissipating support 1424, the conductive pillar 127, and the grounding electrode 130, which avoids damage on the light-emitting diode chip 1428 in the package unit 142 due to the electric shock, so as to solve the problem that the light-emitting diode in the prior art is damaged easily once electrically shocked. The first conductive support 144 can perform conducting discharged static electricity not only during the operation of the backlight module 5 but also during the assembly of the backlight module 5. In addition, although the second conductive support 146 is farther from the laminated optical film 24 than the first conductive support 144 is, the second conductive support 146 can also perform conducting discharged static electricity during the assembly of the backlight module 5 and perform conducting possible discharged static electricity from other portions during the operation.

Figure 10:
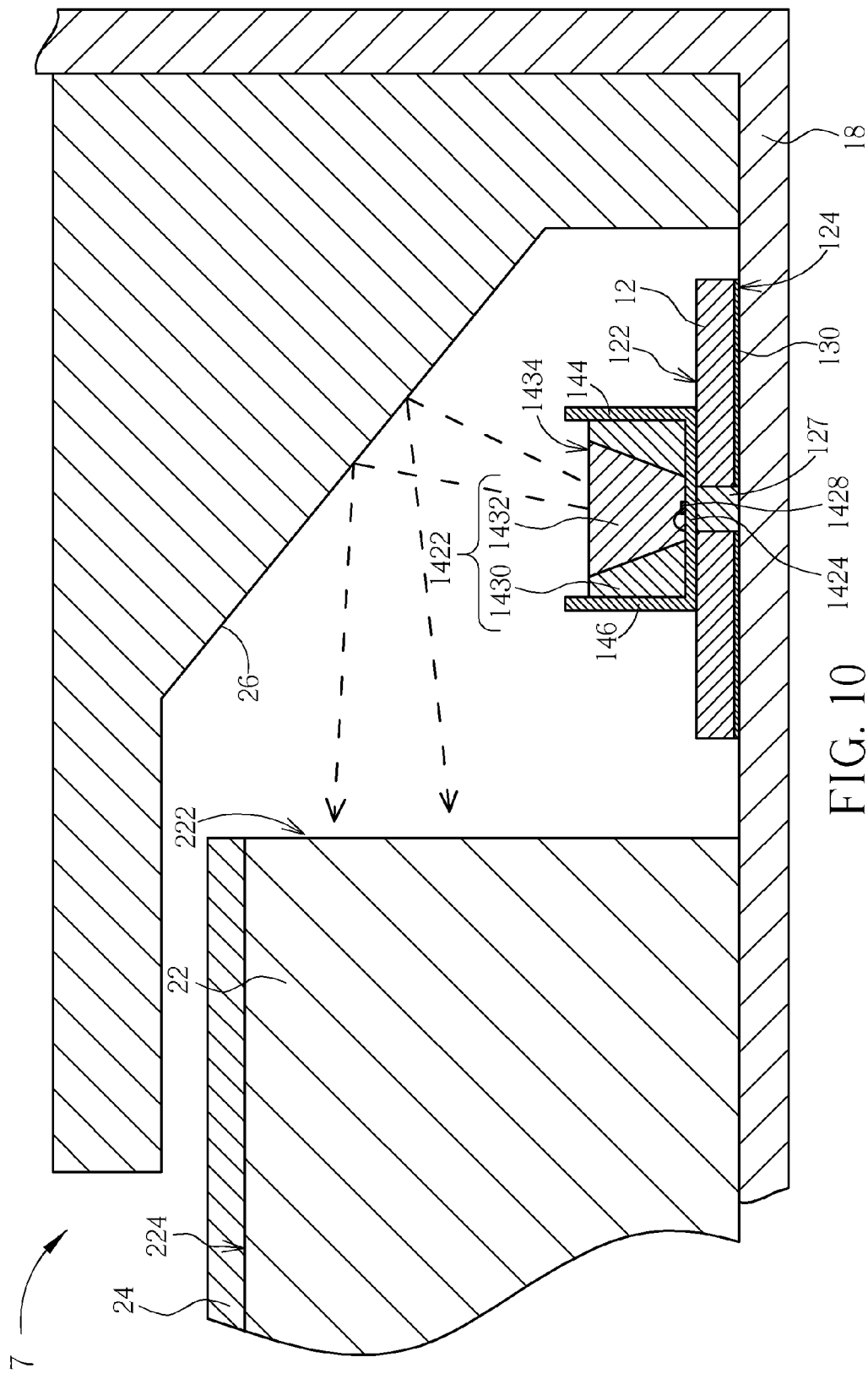
FIG. 10 is a sectional diagram of a backlight module of another embodiment according to the invention.
Figure 11:
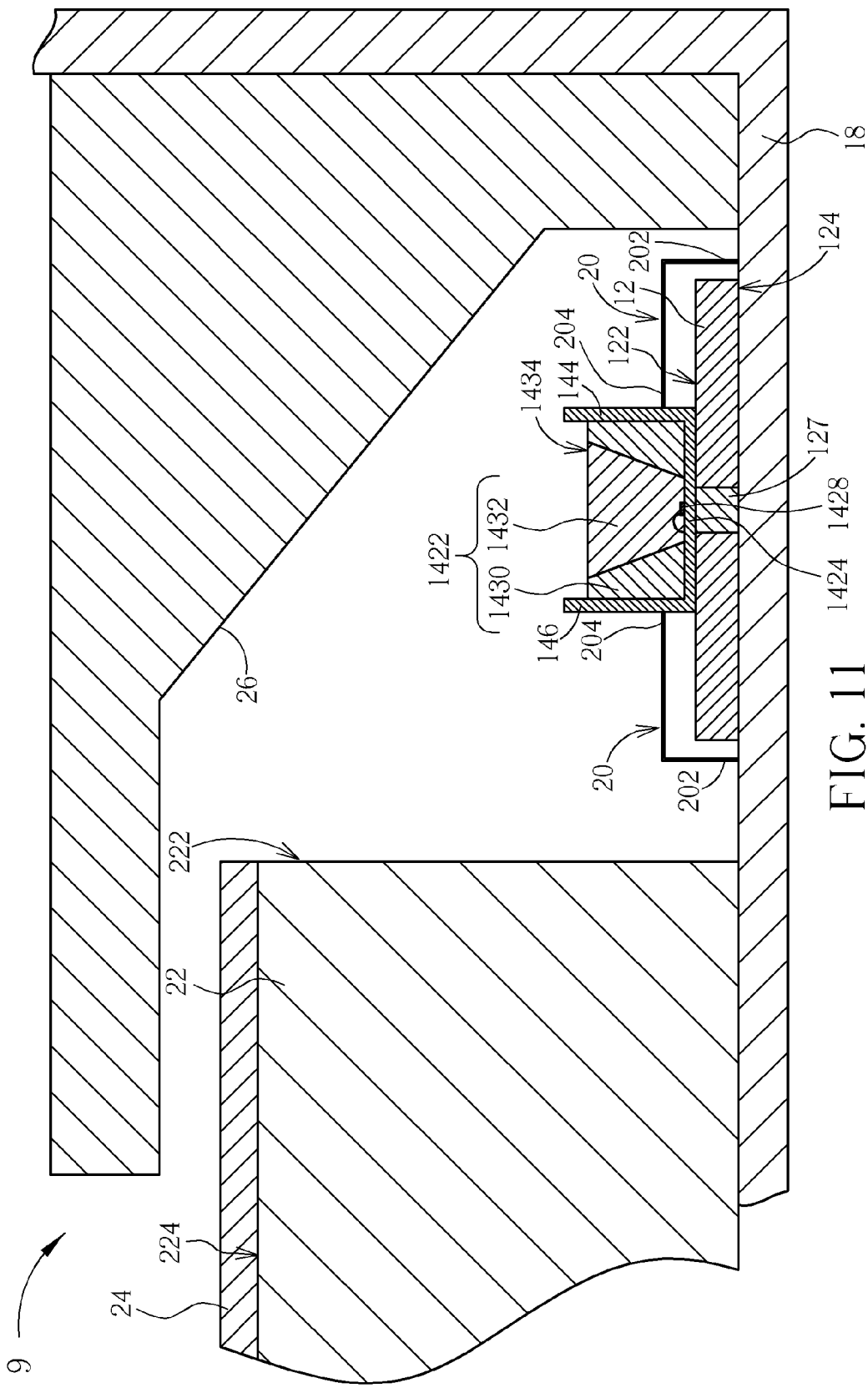
FIG. 11 is a sectional diagram of a backlight module of another embodiment according to the invention.

Please refer to FIG. 10. FIG. 10 is a sectional diagram of a backlight module 7 of another embodiment according to the invention. The difference between the backlight module 7 and the backlight module 5 in FIG. 9 mainly lies in the fact that the circuit board 12 of the backlight module 7 is disposed directly on the metal casing 18 and the light-out surface 1434 of the light-emitting diode 14 is not directly toward the light-in surface 222 of the Light-guiding member 22, so the backlight module 7 further includes a reflection member 26 for reflecting light (shown by dashed lines with arrows) emitted by the light-emitting diode 14 to the light-in surface 222 of the Light-guiding member 22. For descriptions of other members, please refer to the descriptions in the above embodiments and are no longer repeated here. In addition, please refer to FIG. 11. FIG. 11 is a sectional diagram of a backlight module 9 of another embodiment according to the invention. The difference between the backlight module 9 and the backlight module 7 in FIG. 10 mainly lies in the fact that the first conductive support 144 and the second conductive support 146 of the backlight module 9 are grounded through the wires 20, so it is unnecessary for the circuit board 12 to include the grounding electrode 130. For descriptions of other members, please refer to the descriptions in the above embodiments and are no longer repeated here. It is additionally added that the backlight modules in the above embodiments are illustrated with the conductive pillar 127; however, the invention is not limited to this. The above-mentioned light source modules with the conductive via 126 also can be applied to the backlight modules in the above embodiments, which are no longer described.

As illustrated above, the light source module according to the invention includes the protrusive conductive support capable of conducting discharged static electricity. Thereby, during the operation and the assembly of the light source module, if ESD occurs, the discharged static electricity can be conducted by the protrusive conductive support for avoiding damage on the light-emitting diode chip of the light source module. Similarly, the backlight module according to the invention uses the light source module according to the invention, so during the operation and the assembly of the backlight module, if ESD occurs, the discharged static electricity can be conducted by the protrusive conductive support for providing stable backlight. Furthermore, the protrusive conductive support of the light source module and the backlight module according to the invention can be designed in the current production for realizing the purpose of ESD protection. Therefore, compared with the technology of using Zener diode in the prior art, the light source module and the backlight module according to the invention have the advantages of low cost and simplified production and break through the restrictions based on the component specification of the Zener diode to provide more efficient and wider ESD protection.

Those skilled in the art will readily observe that numerous modifications and alterations of the device and method may be made while retaining the teachings of the invention.

What is claimed is:

1. A light source module, comprising:
   a circuit board; and
   a light-emitting diode disposed on the circuit board, the light-emitting diode comprising:
      a package unit comprising an insulation housing, a heat-dissipating support embedded in the insulation housing, and a light-emitting diode chip disposed on the heat-dissipating support and encapsulated by the insulation housing, the light-emitting diode chip having two electrodes, the heat-dissipating support being isolated from the two electrodes, the insulation housing thereon defining a light-out surface; and
      a first conductive support disposed on an exterior side surface of the insulation housing and connected to the heat-dissipating support to protrude out the light-out surface.

2. The light source module of claim 1, wherein the circuit board has a grounding electrode, and the first conductive support is electrically connected to the grounding electrode.

3. The light source module of claim 2, wherein the circuit board has a first surface, a second surface opposite to the first surface, and a conductive via passing through the first surface and the second surface, the light-emitting diode is disposed on the first surface, the grounding electrode is on the second surface, and the first conductive support is electrically connected to the grounding electrode by the conductive via.

4. The light source module of claim 2, wherein the circuit board has a first surface, a second surface opposite to the first surface, and a conductive pillar passing through the first surface and the second surface, the light-emitting diode is disposed on the first surface, the grounding electrode is on the second surface, and the first conductive support is electrically connected to the grounding electrode by the conductive pillar.

5. The light source module of claim 1, further comprising a heat sink disposed outside the light-emitting diode and connected to the heat-dissipating support of the light-emitting diode for dissipating heat produced in operation by the light-emitting diode chip.

6. The light source module of claim 1, further comprising a metal casing disposed outside the light-emitting diode and connected to the heat-dissipating support of the light-emitting diode for dissipating heat produced in operation by the light-emitting diode chip.

7. The light source module of claim 6, further comprising a wire, an end of the wire being connected to the first conductive support, another end of the wire being connected to the metal casing.

8. The light source module of claim 1, wherein the light-emitting diode further comprises a second conductive support disposed on an exterior side surface of the insulation housing opposite to the first conductive support and connected to the heat-dissipating support to protrude out the light-out surface.

9. The light source module of claim 1, wherein a height of the first conductive support protruding out the light-out surface along a direction perpendicular to the light-out surface is 0.2 mm to 1 mm substantially.

10. A backlight module, comprising:
    a circuit board;
    a light-guiding member having a light-in surface and a first light-out surface; and
    a light-emitting diode disposed on the circuit board, the light-emitting diode comprising:
       a package unit comprising an insulation housing, a heat-dissipating support embedded in the insulation housing, and a light-emitting diode chip disposed on the heat-dissipating support and encapsulated by the insulation housing, the light-emitting diode chip having two electrodes, the heat-dissipating support being isolated from the two electrodes, the insulation housing thereon defining a second light-out surface, the second light-out surface being substantially toward the light-in surface; and
       a first conductive support disposed on an exterior side surface of the insulation housing and connected to the heat-dissipating support to protrude out the second light-out surface.

11. The backlight module of claim 10, further comprising an optical film disposed on the first light-out surface.

12. The backlight module of claim 10, wherein the circuit board has a grounding electrode, and the first conductive support is electrically connected to the grounding electrode.

13. The backlight module of claim 12, wherein the circuit board has a first surface, a second surface opposite to the first surface, and a conductive via passing through the first surface and the second surface, the light-emitting diode is disposed on the first surface, the grounding electrode is on the second surface, and the first conductive support is electrically connected to the grounding electrode by the conductive via.

14. The backlight module of claim 12, wherein the circuit board has a first surface, a second surface opposite to the first surface, and a conductive pillar passing through the first surface and the second surface, the light-emitting diode is disposed on the first surface, the grounding electrode is on the second surface, and the first conductive support is electrically connected to the grounding electrode by the conductive pillar.

15. The backlight module of claim 10, further comprising a heat sink disposed outside the light-emitting diode and connected to the heat-dissipating support of the light-emitting diode for dissipating heat produced in operation by the light-emitting diode chip.

16. The backlight module of claim 10, further comprising a metal casing disposed outside the light-emitting diode and connected to the heat-dissipating support of the light-emitting diode for dissipating heat produced in operation by the light-emitting diode chip.

17. The backlight module of claim 16, further comprising a wire, an end of the wire being connected to the first conductive support, another end of the wire being connected to the metal casing.

18. The backlight module of claim 10, wherein the light-emitting diode further comprises a second conductive support disposed on an exterior side surface of the insulation housing opposite to the first conductive support and connected to the heat-dissipating support to protrude out the second light-out surface.

19. The backlight module of claim 10, wherein a height of the first conductive support protruding out the light-out surface along a direction from the light-emitting diode toward the light-guiding member is 0.2 mm to 1 mm substantially.

* * * * *